(12) United States Patent
Zhu (10) Patent No.: US 11,854,461 B2
(45) Date of Patent: Dec. 26, 2023

(54) GOA CIRCUIT AND DISPLAY PANEL

(71) Applicant: TCL CHINA STAR OPTOELECTRONICS TECHNOLOGY CO., LTD., Shenzhen (CN)

(72) Inventor: Jing Zhu, Shenzhen (CN)

(*) Notice: Subject to any disclaimer, the term of this patent is extended or adjusted under 35 U.S.C. 154(b) by 501 days.

(21) Appl. No.: 17/050,847

(22) PCT Filed: Apr. 14, 2020

(86) PCT No.: PCT/CN2020/084770
§ 371 (c)(1),
(2) Date: Oct. 27, 2020

(87) PCT Pub. No.: WO2021/196283
PCT Pub. Date: Oct. 7, 2021

(65) Prior Publication Data
US 2023/0116413 A1   Apr. 13, 2023

(30) Foreign Application Priority Data
Mar. 31, 2020  (CN) .......................... 202010241746.7

(51) Int. Cl.
*G09G 3/20* (2006.01)

(52) U.S. Cl.
CPC ... *G09G 3/2096* (2013.01); *G09G 2310/0267* (2013.01); *G09G 2330/04* (2013.01)

(58) Field of Classification Search
CPC ....... G09G 2310/0267; G09G 2330/04; G09G 3/2096
See application file for complete search history.

(56) References Cited

U.S. PATENT DOCUMENTS

2015/0109279 A1* 4/2015 Gupta ................. G09G 3/3266
345/82
2016/0275872 A1    9/2016 Chaji et al.

FOREIGN PATENT DOCUMENTS

| CN | 104409055 A | 3/2015 | |
|---|---|---|---|
| CN | 104851403 A | 8/2015 | |
| CN | 106128397 A | 11/2016 | |
| CN | 106205528 A | 12/2016 | |
| CN | 106251816 A | 12/2016 | |
| CN | 108962171 A | 12/2018 | |
| CN | 109509459 A * | 3/2019 | .......... G09G 3/3677 |
| CN | 110890077 A | 3/2020 | |

(Continued)

OTHER PUBLICATIONS

International Search Report in International application No. PCT/CN2020/084770, dated Jan. 6, 2021.

(Continued)

*Primary Examiner* — Towfiq Elahi (57) ABSTRACT

The present application discloses a GOA circuit and a display panel. High-temperature durability of a first node is improved not only by adding a thirteenth transistor to a pull-down remaining module to lower a voltage difference between a source and a drain of the an eleventh transistor to suppress electric leakage of the first node, but also by adding a twentieth transistor to the pull-down remaining module to lower a voltage difference between a gate and a source of a nineteenth transistor to suppress electric leakage of the first node.

16 Claims, 4 Drawing Sheets

(56) References Cited

FOREIGN PATENT DOCUMENTS

| KR | 20170141036 A | 12/2017 | |
|---|---|---|---|
| WO | WO-2020151128 A1 * | 7/2020 | ........... G09G 3/3677 |

OTHER PUBLICATIONS

Written Opinion of the International Search Authority in International application No. PCT/CN2020/084770, dated Jan. 6, 2021.
Chinese Office Action issued in corresponding Chinese Patent Application No. 202010241746.7 dated Jan. 5, 2023, pp. 1-8.

* cited by examiner

GOA CIRCUIT AND DISPLAY PANEL

FIELD OF THE DISCLOSURE

The present application relates to display technologies, and more particularly to a gate-on-array (GOA) circuit and display panel.

DESCRIPTION OF RELATED ARTS

In GOA (English full name: Gate Driver on Array) technologies, a gate driving circuit is integrated on an array substrate of a display panel so that a gate driving integrated circuit can be omitted, lowering the cost in two aspects—material and manufacturing processes.

Since all existing products need to pass product reliability test; however, the product reliability test takes a long time, and it has to maintain at high temperature during the product reliability test. Under high temperature conditions for a GOA circuit, some transistors will have serious electric leakage, resulting in serious electric leakage of the GOA circuit and insufficient high-temperature durability.

Technical Problems

Embodiments of the present application provide a GOA circuit and a display panel, which can solve technical problems that electric leakage is serious in the existing GOA circuit during product reliability test and it is insufficient in high-temperature durability.

Technical Solutions

An embodiment of the present application provides a gate-on-array (GOA) circuit, including a plurality of stages of cascaded GOA units, wherein each stage of the GOA units includes a node control module, a stage transmission module, a pull-up module, a pull-down module, a pull-down remaining module and a bootstrap capacitor;
  the node control module is fed with a power-supply signal and a stage transmission signal of a last stage and is electrically connected to a first node, the node control module is configured to control potential of the first node according to the power-supply signal and the stage transmission signal of the last stage;
  the stage transmission module is fed with a clock signal of a current stage and is electrically connected to the first node, the stage transmission module is configured to output the stage transmission signal of the current stage under control of the potential of the first node;
  the pull-up module is fed with the clock signal of the current stage and is electrically connected to the first node, the pull-up module is configured to output a scan signal of the current stage under control of the potential of the first node;
  the pull-down module is fed with the stage transmission signal of a next stage, a first low-level reference signal and a second low-level reference signal and is electrically connected to the first node and the scan signal of the current stage, the pull-down module is configured to pull down the potential of the first node to the potential of the first low-level reference signal under control of the stage transmission signal of the next stage and pull down the scan signal of the current stage to the potential of the second low-level reference signal under control of the stage transmission signal of the next stage;
  the pull-down remaining module is fed with the power-supply signal, the first low-level reference signal and the second low-level reference signal and is electrically connected to the first node, the pull-down remaining module is configured to maintain the potential of the first node and the potential of the scan signal of the current stage according to the power-supply signal, the first low-level reference signal and the second low-level reference signal; wherein the pull-down remaining module is further configured to suppress electric leakage of the first node when the first node is at high potential;
  a first end of the bootstrap capacitor is electrically connected to the first node and a second end of the bootstrap capacitor is electrically connected to the scan signal of the current stage.

In some embodiments, the node control module includes a first transistor; a gate of the first transistor is electrically connected to the stage transmission signal of the last stage, a source of the first transistor is electrically connected to the power-supply signal and a drain of the first transistor is electrically connected to the first node.

In some embodiments, the stage transmission module includes a second transistor; a gate of the second transistor is electrically connected to the first node, a source of the second transistor is electrically connected to the clock signal of the current stage and a drain of the second transistor is electrically connected to the stage transmission signal of the current stage.

In some embodiments, the pull-up module includes a third transistor; a gate of the third transistor is electrically connected to the first node, a source of the third transistor is electrically connected to the clock signal of the current stage and a drain of the third transistor is electrically connected to the scan signal of the current stage.

In some embodiments, both of a gate of the fourth transistor and a gate of the fifth transistor are electrically connected to the stage transmission signal of the next stage, a source of the fourth transistor is electrically connected to the first low-level reference signal, a drain of the fourth transistor is electrically connected to the first node, a source of the fifth transistor is electrically connected to the second low-level reference signal, a drain of the fifth transistor is electrically connected to the scan signal of the current stage.

In some embodiments, the pull-down remaining module includes a sixth transistor, a seventh transistor, an eighth transistor, a ninth transistor, a tenth transistor, an eleventh transistor, a twelfth transistor and a thirteenth transistor;
  a gate and a source of the sixth transistor and a source of the seventh transistor are all electrically connected to the power-supply signal, a drain of the sixth transistor, a gate of the seventh transistor and a drain of the eighth transistor are electrically connected to each other, a drain of the seventh transistor, a drain of the ninth transistor, a gate of the tenth transistor, a gate of the eleventh transistor and a gate of the twelfth transistor are all electrically connected to the second node, a gate of the eighth transistor, a gate of the ninth transistor, a drain of the eleventh transistor and a gate and a source of the thirteenth transistor are all electrically connected to the first node, a drain of the tenth transistor is electrically connected to the scan signal of the current stage, a source of the eighth transistor, a source of the ninth transistor and a source of the twelfth transistor are all electrically connected to the first low-level reference signal, a source of the tenth transistor is electrically connected to the second low-level reference signal, a source of the eleventh transistor, a drain of the twelfth transistor and a drain of the thirteenth transistor are electrically connected to a third node.

In some embodiments, when the first node is at high potential, the thirteenth transistor is turned on to lower a voltage difference between the source and the drain of the eleventh transistor to suppress electric leakage of the first node.

In some embodiments, the pull-down remaining module includes a fourteenth transistor, a fifteenth transistor, a sixteenth transistor, a seventeenth transistor, an eighteenth transistor, a nineteenth transistor and a twentieth transistor;
 a gate and a source of the fourteenth transistor and a source of the fifteenth transistor are all electrically connected to the power-supply signal, a drain of the fourteenth transistor, a gate of the fifteenth transistor and a drain of the sixteenth transistor are electrically connected to each other, a drain of the fifteenth transistor, a drain of the seventeenth transistor, a gate of the eighteenth transistor, a gate of the nineteenth transistor and a drain of the twentieth transistor are all electrically connected to the second node, a gate of the sixteenth transistor, a gate of the seventeenth transistor and a drain of the nineteenth transistor are all electrically connected to the first node, a source of the sixteenth transistor, a source of the seventeenth transistor, a source of the nineteenth transistor and a source of the twentieth transistor are all electrically connected to the first low-level reference signal, a source of the eighteenth transistor is electrically connected to the second low-level reference signal, a drain of the eighteenth transistor is electrically connected to the scan signal of the current stage, a gate of the twentieth transistor is electrically connected to the stage transmission signal of the current stage.

In some embodiments, when the scan signal of the current stage and the stage transmission signal of the current stage are at high potential, the fourteenth transistor, the fifteenth transistor, the sixteenth transistor, the seventeenth transistor and the twentieth transistor are turned on to lower a voltage difference between the gate and the source of the nineteenth transistor to suppress electric leakage of the first node.

An embodiment of the present application further provides a display panel, including a gate-on-array (GOA) circuit including a plurality of stages of cascaded GOA units, wherein each stage of the GOA units includes a node control module, a stage transmission module, a pull-up module, a pull-down module, a pull-down remaining module and a bootstrap capacitor;
 the node control module is fed with a power-supply signal and a stage transmission signal of a last stage and is electrically connected to a first node, the node control module is configured to control potential of the first node according to the power-supply signal and the stage transmission signal of the last stage;
 the stage transmission module is fed with a clock signal of a current stage and is electrically connected to the first node, the stage transmission module is configured to output the stage transmission signal of the current stage under control of the potential of the first node;
 the pull-up module is fed with the clock signal of the current stage and is electrically connected to the first node, the pull-up module is configured to output a scan signal of the current stage under control of the potential of the first node;
 the pull-down module is fed with the stage transmission signal of a next stage, a first low-level reference signal and a second low-level reference signal and is electrically connected to the first node and the scan signal of the current stage, the pull-down module is configured to pull down the potential of the first node to the potential of the first low-level reference signal under control of the stage transmission signal of the next stage and pull down the scan signal of the current stage to the potential of the second low-level reference signal under control of the stage transmission signal of the next stage;
 the pull-down remaining module is fed with the power-supply signal, the first low-level reference signal and the second low-level reference signal and is electrically connected to the first node, the pull-down remaining module is configured to maintain the potential of the first node and the potential of the scan signal of the current stage according to the power-supply signal, the first low-level reference signal and the second low-level reference signal; wherein the pull-down remaining module is further configured to suppress electric leakage of the first node when the first node is at high potential;
 a first end of the bootstrap capacitor is electrically connected to the first node and a second end of the bootstrap capacitor is electrically connected to the scan signal of the current stage.

In some embodiments, the node control module includes a first transistor; a gate of the first transistor is electrically connected to the stage transmission signal of the last stage, a source of the first transistor is electrically connected to the power-supply signal and a drain of the first transistor is electrically connected to the first node.

In some embodiments, the stage transmission module includes a second transistor; a gate of the second transistor is electrically connected to the first node, a source of the second transistor is electrically connected to the clock signal of the current stage and a drain of the second transistor is electrically connected to the stage transmission signal of the current stage.

In some embodiments, the pull-up module includes a third transistor; a gate of the third transistor is electrically connected to the first node, a source of the third transistor is electrically connected to the clock signal of the current stage and a drain of the third transistor is electrically connected to the scan signal of the current stage.

In some embodiments, both of a gate of the fourth transistor and a gate of the fifth transistor are electrically connected to the stage transmission signal of the next stage, a source of the fourth transistor is electrically connected to the first low-level reference signal, a drain of the fourth transistor is electrically connected to the first node, a source of the fifth transistor is electrically connected to the second low-level reference signal, a drain of the fifth transistor is electrically connected to the scan signal of the current stage.

In some embodiments, the pull-down remaining module includes a sixth transistor, a seventh transistor, an eighth transistor, a ninth transistor, a tenth transistor, an eleventh transistor, a twelfth transistor and a thirteenth transistor;
 a gate and a source of the sixth transistor and a source of the seventh transistor are all electrically connected to the power-supply signal, a drain of the sixth transistor, a gate of the seventh transistor and a drain of the eighth transistor are electrically connected to each other, a drain of the seventh transistor, a drain of the ninth transistor, a gate of the tenth transistor, a gate of the eleventh transistor and a gate of the twelfth transistor are all electrically connected to the second node, a gate of the eighth transistor, a gate of the ninth transistor, a drain of the eleventh transistor and a gate and a source of the thirteenth transistor are all electrically connected to the first node, a drain of the tenth transistor is electrically connected to the scan signal of the current stage, a source of the eighth transistor, a source of the ninth transistor and a source of the twelfth transistor are all electrically connected to the first low-level reference signal, a source of the tenth transistor is electrically connected to the second low-level reference signal, a source of the eleventh transistor, a drain of the twelfth transistor and a drain of the thirteenth transistor are electrically connected to a third node.

In some embodiments, when the first node is at high potential, the thirteenth transistor is turned on to lower a voltage difference between the source and the drain of the eleventh transistor to suppress electric leakage of the first node.

In some embodiments, the pull-down remaining module includes a fourteenth transistor, a fifteenth transistor, a sixteenth transistor, a seventeenth transistor, an eighteenth transistor, a nineteenth transistor and a twentieth transistor;
a gate and a source of the fourteenth transistor and a source of the fifteenth transistor are all electrically connected to the power-supply signal, a drain of the fourteenth transistor, a gate of the fifteenth transistor and a drain of the sixteenth transistor are electrically connected to each other, a drain of the fifteenth transistor, a drain of the seventeenth transistor, a gate of the eighteenth transistor, a gate of the nineteenth transistor and a drain of the twentieth transistor are all electrically connected to the second node, a gate of the sixteenth transistor, a gate of the seventeenth transistor and a drain of the nineteenth transistor are all electrically connected to the first node, a source of the sixteenth transistor, a source of the seventeenth transistor, a source of the nineteenth transistor and a source of the twentieth transistor are all electrically connected to the first low-level reference signal, a source of the eighteenth transistor is electrically connected to the second low-level reference signal, a drain of the eighteenth transistor is electrically connected to the scan signal of the current stage, a gate of the twentieth transistor is electrically connected to the stage transmission signal of the current stage.

Beneficial Effects

In the GOA circuit and the display panel provided in the embodiments of the present application, high-temperature durability of the first node is improved not only by adding the thirteenth transistor to the pull-down remaining module to lower the voltage difference between the source and the drain of the eleventh transistor to suppress electric leakage of the first node, but also by adding the twentieth transistor to the pull-down remaining module to lower the voltage difference between the gate and the source of the nineteenth transistor to suppress electric leakage of the first node.

DESCRIPTION OF DRAWINGS

The technical solutions and other beneficial effects of the present application will be more apparent with reference to the detailed descriptions of the embodiments of the present application below in accompanying with the drawings.

DESCRIPTION OF EMBODIMENTS OF THE DISCLOSURE

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

In the description of the present application, it is to be understood that the terms "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicated orientation or positional relationship are based on the relationship of the position or orientation shown in the drawings, which is only for the purpose of facilitating description of the present application and simplifying the description, but is not intended to or implied that the device or element referred to must have a specific orientation, and be constructed and operated in a particular orientation. Therefore, it should not be construed as a limitation of the present application. In addition, the terms "first" and "second" are used for descriptive purposes only, and should not be taken to indicate or imply relative importance, or implicitly indicate the indicated number of technical features. Thus, by defining a feature with "first" or "second", it may explicitly or implicitly include one or more features. In the description of the present application, "a plurality" means two or more unless explicitly defined.

In the description of the present application, it should be noted that unless otherwise explicitly specified or limited, the terms "installed", "connected", and "connection" should be construed broadly, for example, a fixed connection, a removable connection, or integrally connected. These terms may be directed to a mechanical connection, and may also be directed to an electrical connection or communication. Moreover, these terms can be directed to "directly attached", "indirectly connected" through an intermediate medium, and may be directed to "internally communicated" with two components or the "interaction relationship" between two components. For persons skilled in the art, they can understand the specific meaning of the terms in the present application based on specific conditions.

In the present application, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides a plurality of different embodiments or examples to implement different structures of this application. To simplify the disclosure of this application, the following describes components and settings in particular examples. Certainly, the examples are merely for illustrative purposes, and are not intended to limit this application. In addition, in this application, reference numerals and/or reference letters may be repeated in different examples. This repetition is for the purpose of simplicity and clarity, and does not in itself indicate a relationship between the various embodiments and/or settings that are discussed. In addition, this application provides examples of various particular processes and materials, but a person of ordinary skill in the art will recognize that other processes and/or materials may be applied and/or used.

Transistors utilized in all of embodiments of the present application can by thin-film transistors or field-effect transistor or other devices having same properties. Since a source and a drain of the transistor utilized herein are symmetric, the source and the drain are interchangeable. In the embodiments of the present application, in order to distinguish the two electrodes of the transistor except for a gate, one of the two electrodes is called a source and the other of the two electrodes is called a drain. A middle end of the switch transistor is the gate, a signal input end of which is the source and a signal output end of which is the drain, as specified according to a shape or pattern shown in the appending figures. In addition, the transistors utilized in the embodiments of the present application are all N-type transistors or P-type transistors. The N-type transistor is turned on when the gate is at high voltage level and is turned off when the gate is at low voltage level; The P-type transistor is turned on when the gate is at low voltage level and is turned off when the gate is at high voltage level.

Figure 1:
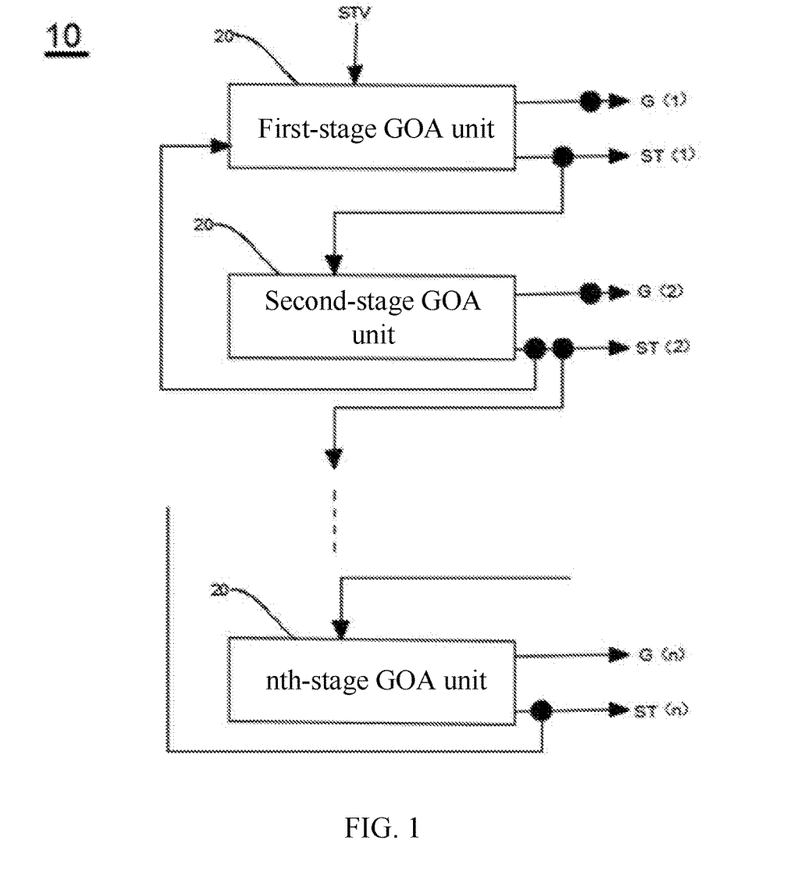
FIG. 1 is a structural schematic diagram illustrating a GOA circuit provided in an embodiment of the present application.

FIG. 1 is a structural schematic diagram illustrating a GOA circuit provided in an embodiment of the present application. As shown in FIG. 1, the GOA circuit 10 provided in the embodiment of the present application includes a plurality of stages of cascaded GOA units 20. Each stage of the GOA units 20 is configured to output a scan signal and a stage transmission signal. When the GOA unit 10 is operated, a first-stage GOA unit 20 is fed with a start signal STV and after that, a second-stage GOA unit 20, a third-stage GOA unit 20, . . . , and a last-stage GOA unit 20 are conducted in a cascading fashion and activated sequentially.

Figure 2:
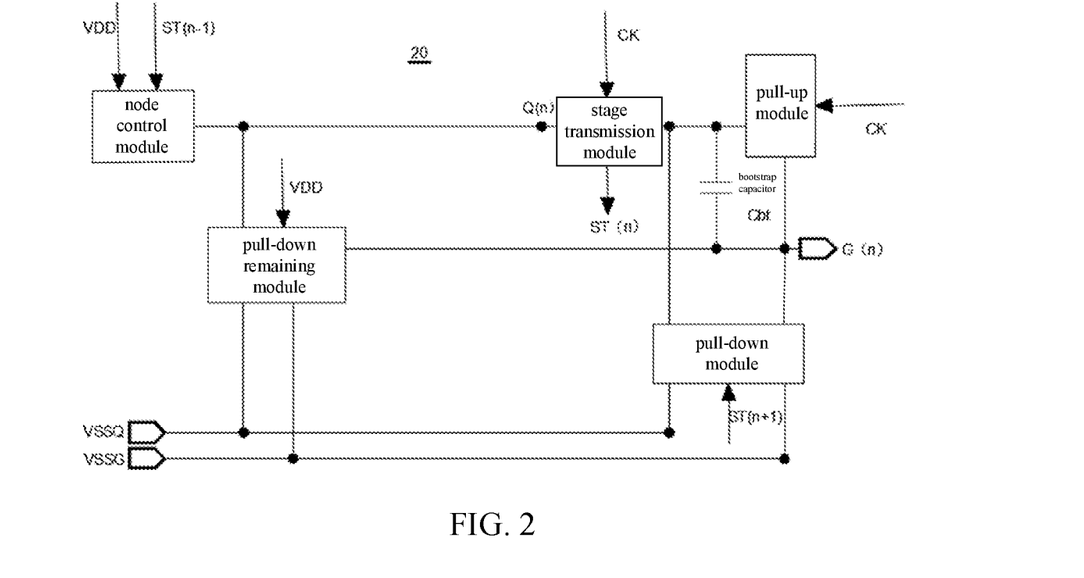
FIG. 2 is a first circuit schematic diagram illustrating a GOA unit in a GOA unit provided in an embodiment of the present application.

Further, FIG. 2 is a first circuit schematic diagram illustrating a GOA unit in a GOA unit provided in an embodiment of the present application. As shown in FIG. 2, the GOA unit 20 includes a node control module, a stage transmission module, a pull-up module, a pull-down module, a pull-down remaining module and a bootstrap capacitor Cbt.

The node control module is fed with a power-supply signal VDD and a stage transmission signal of a last stage ST(n−1) and is electrically connected to a first node Q(n). The node control module is configured to control potential of the first node Q(n) according to the power-supply signal VDD and the stage transmission signal of the last stage ST(n−1).

The stage transmission module is fed with a clock signal CK of a current stage and is electrically connected to the first node Q(n). The stage transmission module is configured to output the stage transmission signal of the current stage ST(n) under control of the potential of the first node Q(n).

The pull-up module is fed with the clock signal CK of the current stage and is electrically connected to the first node Q(n). The pull-up module is configured to output a scan signal of the current stage G(n) under control of the potential of the first node Q(n).

The pull-down module is fed with the stage transmission signal of a next stage ST(n+1), a first low-level reference signal VSSQ and a second low-level reference signal VSSG and is electrically connected to the first node Q(n) and the scan signal of the current stage G(n). The pull-down module is configured to pull down the potential of the first node Q(n) to the potential of the first low-level reference signal VSSQ under control of the stage transmission signal of the next stage ST(n+1) and pull down the scan signal of the current stage G(n) to the potential of the second low-level reference signal VSSG under control of the stage transmission signal of the next stage ST(n+1).

The pull-down remaining module is fed with the power-supply signal VDD, the first low-level reference signal VSSQ and the second low-level reference signal VSSG and is electrically connected to the first node Q(n). The pull-down remaining module is configured to maintain the potential of the first node Q(n) and the potential of the scan signal of the current stage G(n) according to the power-supply signal VDD, the first low-level reference signal VSSQ and the second low-level reference signal VSSG. The pull-down remaining module is further configured to suppress electric leakage of the first node Q(n) when the first node Q(n) is at high potential.

A first end of the bootstrap capacitor Cbt is electrically connected to the first node Q(n) and a second end of the bootstrap capacitor Cbt is electrically connected to the scan signal of the current stage G(n).

Figure 3:
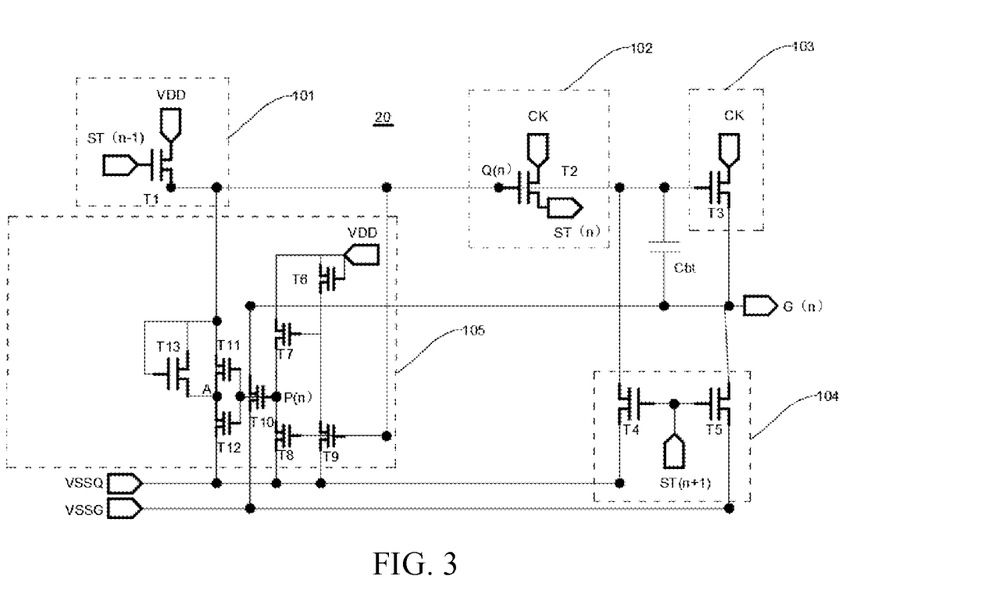
FIG. 3 is a second circuit schematic diagram illustrating a GOA unit in a GOA unit provided in an embodiment of the present application.

Further, please refer to FIGS. 2 and 3. FIG. 3 is a second circuit schematic diagram illustrating a GOA unit in a GOA unit provided in an embodiment of the present application. As shown in FIG. 3, the GOA unit 20 includes a node control module 101, a stage transmission module 102, a pull-up module 103, a pull-down module 104, a pull-down remaining module 105 and a bootstrap capacitor Cbt.

In some embodiments, the node control module 101 includes a first transistor T1; a gate of the first transistor T1 is electrically connected to the stage transmission signal of the last stage ST(n−1), a source of the first transistor T1 is electrically connected to the power-supply signal VDD and a drain of the first transistor is electrically connected to the first node Q(n).

In some embodiments, the stage transmission module 102 includes a second transistor T2; a gate of the second transistor T2 is electrically connected to the first node Q(n), a source of the second transistor T2 is electrically connected to the clock signal CK of the current stage and a drain of the second transistor T2 is electrically connected to the stage transmission signal of the current stage ST(n).

In some embodiments, the pull-up module 103 includes a third transistor T3; a gate of the third transistor T3 is electrically connected to the first node Q(n), a source of the third transistor T3 is electrically connected to the clock signal CK of the current stage and a drain of the third transistor T3 is electrically connected to the scan signal of the current stage G(n).

In some embodiments, the pull-down module 104 includes a fourth transistor T4 and a fifth transistor T5; both of a gate of the fourth transistor T4 and a gate of the fifth transistor T5 are electrically connected to the stage transmission signal of the next stage ST(n+1), a source of the fourth transistor T4 is electrically connected to the first low-level reference signal VSSQ, a drain of the fourth transistor T4 is electrically connected to the first node Q(n), a source of the fifth transistor T5 is electrically connected to the second low-level reference signal VSSG, a drain of the fifth transistor T5 is electrically connected to the scan signal of the current stage G(n).

In some embodiments, the pull-down remaining module 105 includes a sixth transistor T6, a seventh transistor T7, an eighth transistor T8, a ninth transistor T9, a tenth transistor T10, an eleventh transistor T11, a twelfth transistor T12 and a thirteenth transistor T13; a gate and a source of the sixth transistor T6 and a source of the seventh transistor T7 are all electrically connected to the power-supply signal VDD, a drain of the sixth transistor T6, a gate of the seventh transistor T7 and a drain of the eighth transistor T8 are electrically connected to each other, a drain of the seventh transistor T7, a drain of the ninth transistor T9, a gate of the tenth transistor T10, a gate of the eleventh transistor T11 and a gate of the twelfth transistor T12 are all electrically connected to the second node P(n), a gate of the eighth transistor T8, a gate of the ninth transistor T9, a drain of the eleventh transistor T11 and a gate and a source of the thirteenth transistor T13 are all electrically connected to the first node Q(n), a drain of the tenth transistor T10 is electrically connected to the scan signal of the current stage G(n), a source of the eighth transistor T8, a source of the ninth transistor T9 and a source of the twelfth transistor T12 are all electrically connected to the first low-level reference signal VSSQ, a source of the tenth transistor T10 is electrically connected to the second low-level reference signal VSSG, a source of the eleventh transistor T11, a drain of the twelfth transistor T12 and a drain of the thirteenth transistor T13 are electrically connected to a third node A.

Figure 4:
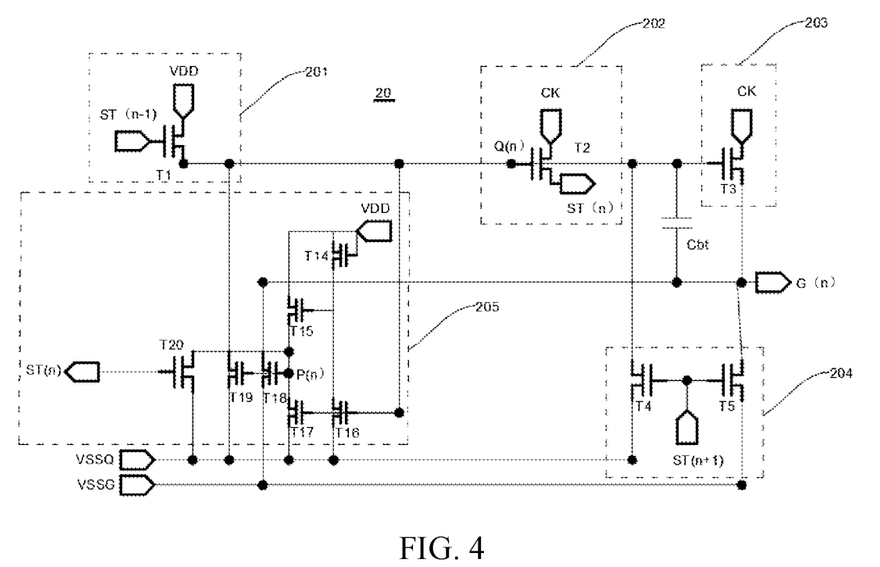
FIG. 4 is a third circuit schematic diagram illustrating a GOA unit in a GOA unit provided in an embodiment of the present application.

Further, please refer to FIGS. 2 and 4. FIG. 4 is a third circuit schematic diagram illustrating a GOA unit in a GOA unit provided in an embodiment of the present application. As shown in FIG. 4, the GOA unit 20 includes a node control module 201, a stage transmission module 202, a pull-up module 203, a pull-down module 204, a pull-down remaining module 205 and a bootstrap capacitor Cbt.

The structures of the node control module 201 and the node control module 101 are identical and play a same role.

The structures of the stage transmission module 202 and the stage transmission module 102 are identical and play a same role. The structures of the pull-up module 203 and the pull-up module 103 are identical and play a same role. The structures of the pull-down module 204 and the pull-down module 104 are identical and play a same role. Therefore, the specific structures of the node control module 201, the stage transmission module 202, the pull-up module 203 and the pull-down module 204 are not repeated herein, and reference to above embodiments may be made for these modules.

In some embodiments, the pull-down remaining module 205 includes a fourteenth transistor T14, a fifteenth transistor T15, a sixteenth transistor T16, a seventeenth transistor T17, an eighteenth transistor T18, a nineteenth transistor T19 and a twentieth transistor T20;

a gate and a source of the fourteenth transistor T14 and a source of the fifteenth transistor T15 are all electrically connected to the power-supply signal, a drain of the fourteenth transistor T14, a gate of the fifteenth transistor T15 and a drain of the sixteenth transistor T16 are electrically connected to each other, a drain of the fifteenth transistor T15, a drain of the seventeenth transistor T17, a gate of the eighteenth transistor T18, a gate of the nineteenth transistor T19 and a drain of the twentieth transistor T20 are all electrically connected to the second node P(n), a gate of the sixteenth transistor T16, a gate of the seventeenth transistor T17 and a drain of the nineteenth transistor T19 are all electrically connected to the first node Q(n), a source of the sixteenth transistor T16, a source of the seventeenth transistor T17, a source of the nineteenth transistor T19 and a source of the twentieth transistor T20 are all electrically connected to the first low-level reference signal VSSQ, a source of the eighteenth transistor T18 is electrically connected to the second low-level reference signal VSSG, a drain of the eighteenth transistor T18 is electrically connected to the scan signal of the current stage G(n), a gate of the twentieth transistor T20 is electrically connected to the stage transmission signal of the current stage ST(n).

Figure 5:
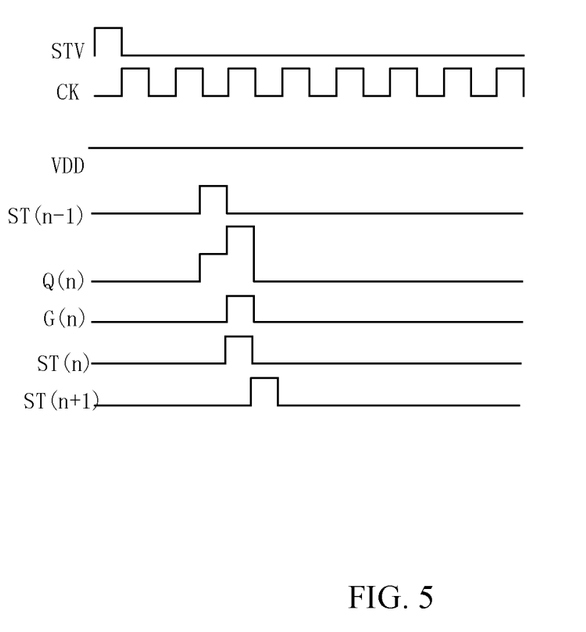
FIG. 5 is a signal timing diagram of a GOA unit in a GOA unit provided in an embodiment of the present application.

Specifically, please refer to FIGS. 3 and 5 together. FIG. 5 is a signal timing diagram of a GOA unit in a GOA unit provided in an embodiment of the present application. When the stage transmission signal of the last stage ST(n−1) is at high voltage level and the power-supply signal VDD is at high potential, the first transistor T1 is turned on and the power-supply signal VDD charges the bootstrap capacitor Cbt via the first transistor T1 such that the potential of the first node Q(n) is risen to higher potential.

After that, the stage transmission signal of the last stage ST(n−1) turns to low voltage level, the first transistor T1 is turned off and the potential of the first node Q(n) maintains at higher potential by the bootstrap capacitor Cbt. Meanwhile, the potential of the clock signal CK of the current stage turns to high potential and the clock signal CK of the current stage continues to charge the bootstrap capacitor Cbt via the second transistor T2 such that the potential of the first node Q(n) reaches highest potential. The scan signal of the current stage G(n) and the stage transmission signal of the current stage ST(n) also turn to high potential and the power-supply signal VDD is also at high potential such that the sixth transistor T6, the seventh transistor T7, the eighth transistor T8 and the ninth transistor T9 are turned on, making the potential of the second node P(n) maintain at the potential of the first low-level reference signal VSSQ.

Next, when the stage transmission signal of the next stage ST(n+1) turns to high voltage level, the fourth transistor T4 and the fifth transistor T5 are turned on, the first low-level reference signal VSSQ pulls down the potential of the first node Q(n), and the second low-level reference signal VSSG pulls down the scan signal of the current stage G(n).

Lastly, since the potential of the first node Q(n) turns to low potential, the eighth transistor T8 and the ninth transistor T9 are turned off. Meanwhile, the power-supply signal VDD is at high potential such that the sixth transistor T6 and the seventh transistor T7 are turned on. This makes the potential of the second node P(n) is risen to high potential such that the tenth transistor T10, the eleventh transistor T11 and the twelfth transistor T12 are turned on and the first low-level reference signal VSSQ maintains the potential of the first node Q(n) at the potential of the first low-level reference signal VSSQ, thereby maintaining the potential of the scan signal of the current stage G(n) at the potential of the second low-level reference signal VSSG.

Specifically, by adding the thirteenth transistor T13 to the pull-down remaining module 105, the embodiment of the present application can thus make the thirteenth transistor T13 turned on when the first node Q(n) is at high potential and accordingly, can charge the first node A such that the third node A is risen to high potential to lower a voltage difference between the source and the drain of the eleventh transistor T11. The amplitude of electric leakage of a transistor primarily depends on the voltage difference between the source and the drain of the transistor and the voltage difference between the gate and the source of the transistor. When the voltage difference between the gate and the source of the transistor is fixed, the greater the voltage difference between the source and the drain of the transistor, the more serious the electric leakage. When the voltage difference between the source and the drain of the transistor is fixed, the less the voltage difference between the gate and the source of the transistor, the smaller the electric leakage, and a best result is achieved in a certain area. Therefore, lowering the voltage difference between the source and the drain of the eleventh transistor T11 can achieve an effect of suppressing electric leakage of the eleventh transistor T11, thereby suppressing electric leakage of the first node Q(n) and improving high-temperature durability of the first node Q(n).

Specifically, please refer to FIGS. 4 and 5 together. When the stage transmission signal of the last stage ST(n−1) is at high voltage level and the power-supply signal VDD is at high potential, the first transistor T1 is turned on and the power-supply signal VDD charges the bootstrap capacitor Cbt via the first transistor T1 such that the potential of the first node Q(n) is risen to higher potential.

After that, the stage transmission signal of the last stage ST(n−1) turns to low voltage level, the first transistor T1 is turned off and the potential of the first node Q(n) maintains at higher potential by the bootstrap capacitor Cbt. Meanwhile, the potential of the clock signal CK of the current stage turns to high potential and the clock signal CK of the current stage continues to charge the bootstrap capacitor Cbt via the second transistor T2 such that the potential of the first node Q(n) reaches highest potential. The scan signal of the current stage G(n) and the stage transmission signal of the current stage ST(n) also turn to high potential and the power-supply signal VDD is also at high potential such that the fourteenth transistor T14, the fifteenth transistor T15, the sixteenth transistor T16, the seventeenth transistor T17 and the twentieth transistor T20 are turned on, making the potential of the second node P(n) maintain at the potential of the first low-level reference signal VSSQ.

Next, when the stage transmission signal of the next stage ST(n+1) turns to high voltage level, the fourth transistor T4 and the fifth transistor T5 are turned on, the first low-level reference signal VSSQ pulls down the potential of the first node Q(n), and the second low-level reference signal VSSG pulls down the scan signal of the current stage G(n).

Lastly, since the potential of the first node Q(n) turns to low potential, the sixteenth transistor T16 and the seventeenth transistor T17 are turned off. Meanwhile, the power-supply signal VDD is at high potential such that the fourteenth transistor T14 and the fifteenth transistor T15 are turned on. This makes the potential of the second node P(n) is risen to high potential such that the eighteenth transistor T18 and the nineteenth transistor T19 are turned on and the first low-level reference signal VSS1 maintains the potential of the first node Q(n) at the potential of the first low-level reference signal VSSQ, thereby maintaining the potential of the scan signal of the current stage G(n) at the potential of the second low-level reference signal VSSG.

Specifically, by adding the twentieth transistor T20 to the pull-down remaining module 205, the embodiment of the present application can thus make the twentieth transistor T20 turned on when the first node Q(n) and the stage transmission signal of the current stage ST(n) are at high potential and accordingly, the second node P(n) can better maintain at the potential of the first low-level reference signal VSSQ to lower a voltage difference between the source and the gate of the nineteenth transistor T19. The amplitude of electric leakage of a transistor primarily depends on the voltage difference between the source and the drain of the transistor and the voltage difference between the gate and the source of the transistor. When the voltage difference between the gate and the source of the transistor is fixed, the greater the voltage difference between the source and the drain of the transistor, the more serious the electric leakage. When the voltage difference between the source and the drain of the transistor is fixed, the less the voltage difference between the gate and the source of the transistor, the smaller the electric leakage, and a best result is achieved in a certain area. Therefore, lowering the voltage difference between the source and the gate of the nineteenth transistor T19 can achieve an effect of suppressing electric leakage of the nineteenth transistor T19, thereby suppressing electric leakage of the first node Q(n) and improving high-temperature durability of the first node Q(n).

Figure 6:
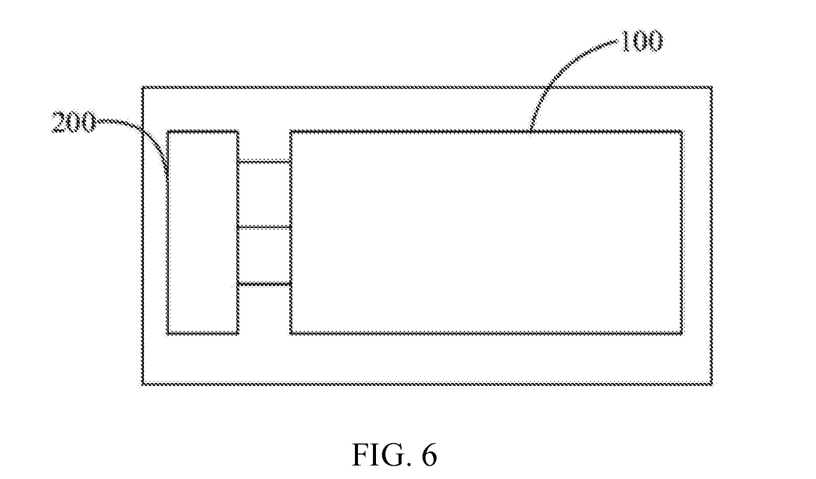
FIG. 6 is a structural schematic diagram illustrating a display panel provided in an embodiment of the present application.

FIG. 6 is a structural schematic diagram illustrating a display panel provided in an embodiment of the present application. As shown in FIG. 6, the display panel includes a display region 100 and a GOA circuit 200 integratedly disposed at peripheral of the display region 100. The structure and principle of the GOA circuit 200 are similar to that of the afore-described GOA circuit 10, and are not repeated herein.

In the above embodiments, different emphasis is placed on respective embodiments, and reference may be made to related depictions in other embodiments for portions not detailed in a certain embodiment.

Hereinbefore, an electronic device provided in the embodiments of the present application is introduced in detail, the principles and implementations of the present application are set forth herein with reference to specific examples, descriptions of the above embodiments are merely served to assist in understanding the technical solutions and essential ideas of the present application. Those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present application.

The invention claimed is:

1. A gate-on-array (GOA) circuit, comprising a plurality of stages of cascaded GOA units, wherein each stage of the GOA units comprises a node control module, a stage transmission module, a pull-up module, a pull-down module, a pull-down remaining module and a bootstrap capacitor;

the node control module is fed with a power-supply signal and a stage transmission signal of a last stage and is electrically connected to a first node, the node control module is configured to control potential of the first node according to the power-supply signal and the stage transmission signal of the last stage;

the stage transmission module is fed with a clock signal of a current stage and is electrically connected to the first node, the stage transmission module is configured to output the stage transmission signal of the current stage under control of the potential of the first node;

the pull-up module is fed with the clock signal of the current stage and is electrically connected to the first node, the pull-up module is configured to output a scan signal of the current stage under control of the potential of the first node;

the pull-down module is fed with the stage transmission signal of a next stage, a first low-level reference signal and a second low-level reference signal and is electrically connected to the first node and the scan signal of the current stage, the pull-down module is configured to pull down the potential of the first node to the potential of the first low-level reference signal under control of the stage transmission signal of the next stage and pull down the scan signal of the current stage to the potential of the second low-level reference signal under control of the stage transmission signal of the next stage;

the pull-down remaining module is fed with the power-supply signal, the first low-level reference signal and the second low-level reference signal and is electrically connected to the first node, the pull-down remaining module is configured to maintain the potential of the first node and the potential of the scan signal of the current stage according to the power-supply signal, the first low-level reference signal and the second low-level reference signal; wherein the pull-down remaining module is further configured to suppress electric leakage of the first node when the first node is at high potential;

a first end of the bootstrap capacitor is electrically connected to the first node and a second end of the bootstrap capacitor is electrically connected to the scan signal of the current stage, wherein the pull-down remaining module comprises a sixth transistor, a seventh transistor, an eighth transistor, a ninth transistor, a tenth transistor, an eleventh transistor, a twelfth transistor and a thirteenth transistor;

a gate and a source of the sixth transistor and a source of the seventh transistor are all electrically connected to the power-supply signal, a drain of the sixth transistor, a gate of the seventh transistor and a drain of the eighth transistor are electrically connected to each other, a drain of the seventh transistor, a drain of the ninth transistor, a gate of the tenth transistor, a gate of the eleventh transistor and a gate of the twelfth transistor are all electrically connected to a second node, a gate of the eighth transistor, a gate of the ninth transistor, a drain of the eleventh transistor and a gate and a source of the thirteenth transistor are all electrically connected to the first node, a drain of the tenth transistor is electrically connected to the scan signal of the current stage, a source of the eighth transistor, a source of the ninth transistor and a source of the twelfth transistor are all electrically connected to the first low-level reference signal, a source of the tenth transistor is electrically connected to the second low-level reference signal, a source of the eleventh transistor, a drain of the twelfth transistor and a drain of the thirteenth transistor are electrically connected to a third node.

2. The GOA circuit according to claim 1, wherein the node control module comprises a first transistor;

a gate of the first transistor is electrically connected to the stage transmission signal of the last stage, a source of the first transistor is electrically connected to the power-supply signal and a drain of the first transistor is electrically connected to the first node.

3. The GOA circuit according to claim 1, wherein the stage transmission module comprises a second transistor;

a gate of the second transistor is electrically connected to the first node, a source of the second transistor is electrically connected to the clock signal of the current stage and a drain of the second transistor is electrically connected to the stage transmission signal of the current stage.

4. The GOA circuit according to claim 1, wherein the pull-up module comprises a third transistor;

a gate of the third transistor is electrically connected to the first node, a source of the third transistor is electrically connected to the clock signal of the current stage and a drain of the third transistor is electrically connected to the scan signal of the current stage.

5. The GOA circuit according to claim 1, wherein the pull-down module comprises a fourth transistor and a fifth transistor;

both of a gate of the fourth transistor and a gate of the fifth transistor are electrically connected to the stage transmission signal of the next stage, a source of the fourth transistor is electrically connected to the first low-level reference signal, a drain of the fourth transistor is electrically connected to the first node, a source of the fifth transistor is electrically connected to the second low-level reference signal, a drain of the fifth transistor is electrically connected to the scan signal of the current stage.

6. The GOA circuit according to claim 1, wherein when the first node is at high potential, the thirteenth transistor is turned on to lower a voltage difference between the source and the drain of the eleventh transistor to suppress electric leakage of the first node.

7. The GOA circuit according to claim 1, wherein the pull-down remaining module comprises a fourteenth transistor, a fifteenth transistor, a sixteenth transistor, a seventeenth transistor, an eighteenth transistor, a nineteenth transistor and a twentieth transistor;

a gate and a source of the fourteenth transistor and a source of the fifteenth transistor are all electrically connected to the power-supply signal, a drain of the fourteenth transistor, a gate of the fifteenth transistor and a drain of the sixteenth transistor are electrically connected to each other, a drain of the fifteenth transistor, a drain of the seventeenth transistor, a gate of the eighteenth transistor, a gate of the nineteenth transistor and a drain of the twentieth transistor are all electrically connected to a second node, a gate of the sixteenth transistor, a gate of the seventeenth transistor and a drain of the nineteenth transistor are all electrically connected to the first node, a source of the sixteenth transistor, a source of the seventeenth transistor, a source of the nineteenth transistor and a source of the twentieth transistor are all electrically connected to the first low-level reference signal, a source of the eighteenth transistor is electrically connected to the second low-level reference signal, a drain of the eighteenth transistor is electrically connected to the scan signal of the current stage, a gate of the twentieth transistor is electrically connected to the stage transmission signal of the current stage.

8. The GOA circuit according to claim 7, wherein the scan signal of the current stage and the stage transmission signal of the current stage are at high potential, the fourteenth transistor, the fifteenth transistor, the sixteenth transistor, the seventeenth transistor and the twentieth transistor are turned on to lower a voltage difference between the gate and the source of the nineteenth transistor to suppress electric leakage of the first node.

9. A display panel, comprising a gate-on-array (GOA) circuit comprising a plurality of stages of cascaded GOA units, wherein each stage of the GOA units comprises a node control module, a stage transmission module, a pull-up module, a pull-down module, a pull-down remaining module and a bootstrap capacitor;

the node control module is fed with a power-supply signal and a stage transmission signal of a last stage and is electrically connected to a first node, the node control module is configured to control potential of the first node according to the power-supply signal and the stage transmission signal of the last stage;

the stage transmission module is fed with a clock signal of a current stage and is electrically connected to the first node, the stage transmission module is configured to output the stage transmission signal of the current stage under control of the potential of the first node;

the pull-up module is fed with the clock signal of the current stage and is electrically connected to the first node, the pull-up module is configured to output a scan signal of the current stage under control of the potential of the first node;

the pull-down module is fed with the stage transmission signal of a next stage, a first low-level reference signal and a second low-level reference signal and is electrically connected to the first node and the scan signal of the current stage, the pull-down module is configured to pull down the potential of the first node to the potential of the first low-level reference signal under control of the stage transmission signal of the next stage and pull down the scan signal of the current stage to the potential of the second low-level reference signal under control of the stage transmission signal of the next stage;

the pull-down remaining module is fed with the power-supply signal, the first low-level reference signal and the second low-level reference signal and is electrically connected to the first node, the pull-down remaining module is configured to maintain the potential of the first node and the potential of the scan signal of the current stage according to the power-supply signal, the first low-level reference signal and the second low-level reference signal; wherein the pull-down remaining module is further configured to suppress electric leakage of the first node when the first node is at high potential;

a first end of the bootstrap capacitor is electrically connected to the first node and a second end of the bootstrap capacitor is electrically connected to the scan signal of the current stage, wherein the pull-down remaining module comprises a sixth transistor, a seventh transistor, an eighth transistor, a ninth transistor, a tenth transistor, an eleventh transistor, a twelfth transistor and a thirteenth transistor;

a gate and a source of the sixth transistor and a source of the seventh transistor are all electrically connected to the power-supply signal, a drain of the sixth transistor, a gate of the seventh transistor and a drain of the eighth transistor are electrically connected to each other, a drain of the seventh transistor, a drain of the ninth transistor, a gate of the tenth transistor, a gate of the eleventh transistor and a gate of the twelfth transistor are all electrically connected to a second node, a gate of the eighth transistor, a gate of the ninth transistor, a drain of the eleventh transistor and a gate and a source of the thirteenth transistor are all electrically connected to the first node, a drain of the tenth transistor is electrically connected to the scan signal of the current stage, a source of the eighth transistor, a source of the ninth transistor and a source of the twelfth transistor are all electrically connected to the first low-level reference signal, a source of the tenth transistor is electrically connected to the second low-level reference signal, a source of the eleventh transistor, a drain of the twelfth transistor and a drain of the thirteenth transistor are electrically connected to a third node.

10. The GOA circuit display panel according to claim 9, wherein the node control module comprises a first transistor;

a gate of the first transistor is electrically connected to the stage transmission signal of the last stage, a source of the first transistor is electrically connected to the power-supply signal and a drain of the first transistor is electrically connected to the first node.

11. The GOA circuit display panel according to claim 9, wherein the stage transmission module comprises a second transistor;

a gate of the second transistor is electrically connected to the first node, a source of the second transistor is electrically connected to the clock signal of the current stage and a drain of the second transistor is electrically connected to the stage transmission signal of the current stage.

12. The GOA circuit display panel according to claim 9, wherein the pull-up module comprises a third transistor;

a gate of the third transistor is electrically connected to the first node, a source of the third transistor is electrically connected to the clock signal of the current stage and a drain of the third transistor is electrically connected to the scan signal of the current stage.

13. The GOA circuit display panel according to claim 9, wherein the pull-down module comprises a fourth transistor and a fifth transistor;

both of a gate of the fourth transistor and a gate of the fifth transistor are electrically connected to the stage transmission signal of the next stage, a source of the fourth transistor is electrically connected to the first low-level reference signal, a drain of the fourth transistor is electrically connected to the first node, a source of the fifth transistor is electrically connected to the second low-level reference signal, a drain of the fifth transistor is electrically connected to the scan signal of the current stage.

14. The GOA circuit display panel according to claim 9, wherein when the first node is at high potential, the thirteenth transistor is turned on to lower a voltage difference between the source and the drain of the eleventh transistor to suppress electric leakage of the first node.

15. The GOA circuit display panel according to claim 9, wherein the pull-down remaining module comprises a fourteenth transistor, a fifteenth transistor, a sixteenth transistor, a seventeenth transistor, an eighteenth transistor, a nineteenth transistor and a twentieth transistor;

a gate and a source of the fourteenth transistor and a source of the fifteenth transistor are all electrically connected to the power-supply signal, a drain of the fourteenth transistor, a gate of the fifteenth transistor and a drain of the sixteenth transistor are electrically connected to each other, a drain of the fifteenth transistor, a drain of the seventeenth transistor, a gate of the eighteenth transistor, a gate of the nineteenth transistor and a drain of the twentieth transistor are all electrically connected to a second node, a gate of the sixteenth transistor, a gate of the seventeenth transistor and a drain of the nineteenth transistor are all electrically connected to the first node, a source of the sixteenth transistor, a source of the seventeenth transistor, a source of the nineteenth transistor and a source of the twentieth transistor are all electrically connected to the first low-level reference signal, a source of the eighteenth transistor is electrically connected to the second low-level reference signal, a drain of the eighteenth transistor is electrically connected to the scan signal of the current stage, a gate of the twentieth transistor is electrically connected to the stage transmission signal of the current stage.

16. The GOA circuit display panel according to claim 15, wherein the scan signal of the current stage and the stage transmission signal of the current stage are at high potential, the fourteenth transistor, the fifteenth transistor, the sixteenth transistor, the seventeenth transistor and the twentieth transistor are turned on to lower a voltage difference between the gate and the source of the nineteenth transistor to suppress electric leakage of the first node.

\* \* \* \* \*